(12) United States Patent
Pieszala et al.

(10) Patent No.: US 12,362,742 B1
(45) Date of Patent: Jul. 15, 2025

(54) VARIABLE SLEW RATE GATE DRIVER FOR HYBRID SWITCH POWER MODULE

(71) Applicant: GM GLOBAL TECHNOLOGY OPERATIONS LLC, Detroit, MI (US)

(72) Inventors: Michael Z. Pieszala, Panama City, FL (US); Benjamin S. Ngu, Royal Oak, MI (US); Mohammad N. Anwar, Northville, MI (US); Chandra S. Namuduri, Troy, MI (US); Rashmi Prasad, Troy, MI (US); Brian A. Welchko, Oakland Township, MI (US); Yilun Luo, Ann Arbor, MI (US); Khorshed Mohammed Alam, Canton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 21 days.

(21) Appl. No.: 18/603,380

(22) Filed: Mar. 13, 2024

(51) Int. Cl.
  *H03K 17/16* (2006.01)
  *H03K 17/12* (2006.01)
  *H03K 17/687* (2006.01)

(52) U.S. Cl.
  CPC ......... *H03K 17/162* (2013.01); *H03K 17/122* (2013.01); *H03K 17/6871* (2013.01)

(58) Field of Classification Search
  CPC . H03K 17/162; H03K 17/122; H03K 17/6871
  USPC .................................................. 327/108–112
  See application file for complete search history.

(56) References Cited

U.S. PATENT DOCUMENTS

2022/0416782 A1* 12/2022 Akiyama ................ H02M 1/08

FOREIGN PATENT DOCUMENTS

| CN | 115642791 A | 1/2023 |
|---|---|---|
| DE | 10356468 A1 | 10/2004 |
| DE | 102011108495 A1 | 9/2012 |
| DE | 102013212262 A1 | 1/2014 |
| DE | 102016217494 A1 | 3/2018 |
| DE | 112017004119 T5 | 5/2019 |
| DE | 112018002634 T5 | 4/2020 |
| DE | 112018004716 T5 | 6/2020 |
| DE | 102022119439 A1 | 3/2023 |
| DE | 102022120996 A1 | 2/2024 |
| EP | 0664613 A2 | 7/1995 |
| WO | 02052726 A1 | 7/2002 |
| WO | WO2023079820 A1 | 5/2023 |

* cited by examiner

*Primary Examiner* — Tomi Skibinski
(74) *Attorney, Agent, or Firm* — Quinn IP Law

(57) ABSTRACT

A variable slew rate gate drive system for powering an electric machine. The system may include a gate driver operable for controlling each of a plurality of hybrid switch power modules between opened and closed states to facilitate powering the electric machine. The gate driver may be operable for selecting slew rates and controlling ON and OFF states of first and second semiconductor switches included as part of each power module to optimize powering of the electric machine by varying the slew rates as a function of performance characteristics of the first and second semiconductor switches.

20 Claims, 4 Drawing Sheets

VARIABLE SLEW RATE GATE DRIVER FOR HYBRID SWITCH POWER MODULE

INTRODUCTION

The present disclosure relates to systems configured for powering an electric machine, such as but not necessarily limited to a slew rate variable system configured for managing transitions of hybrid switch power modules when operating to provide electrical power to a traction motor of an electric vehicle.

In a power inversion process, pulse width modulation, pulse density modulation, delta-sigma modulation, pulse-frequency modulation, or other application-suitable binary (ON/OFF) switching control signals may be employed to facilitate transitioning switches between different states for purposes of powering an electric machine. The control signals, for example, may alternate a conducting state of the switches to convert direct current (DC) electrical power to alternating current (AC) electrical power suitable for powering the electric machine. Some of the more common switches used in higher power applications, such as those used for electrically powering a traction motor of an electric vehicle, may be voltage and/or current controlled between ON and OFF states. A wide bandgap (WBG), Gallium Nitride (GaN), Silicon Carbide (SiC), and other semiconductor switches, such as Metal Oxide Field Effect transistor (MOSFET) and the Insulated Gate Bipolar Transistor (IGBT) semiconductor switches, may form a class of switches capable of supporting a wide variety of switching events. The rate, speed, timing, etc. of the switching events, or more specifically the transitioning of the switches between ON and OFF or opened and closed states, may be characterized as a slew rate. Depending ON a type of electric machine being powered, such as for example when powering a traction motor used for propelling an electric vehicle, an ability to finely select and control the slew rate may be beneficial in minimizing second order effects, such as overvoltage spikes, electromagnetic interference (EMI) bearing current, voltage overshoot, etc.

SUMMARY

One aspect of the present disclosure relates to a variable slew rate gate drive system for powering an electric machine. The system may include a plurality of hybrid switch power modules operable for converting a direct current (DC) input to an alternating current (AC) output suitable for powering the electric machine. Each of the hybrid switch power modules may include two or more semiconductor switches with at least two of the semiconductor switches having differing performance characteristics. A controller may be configured for varying slew rates of the semiconductor switches to optimize the DC-to-AC conversion according to the differing performance characteristics of the semiconductor switches. The slew rates may be varied to maximize use of the semiconductor switches according to characteristics most suitable for the present operating conditions of the electric machine.

One aspect of the present disclosure relates to a variable slew rate gate drive system for powering an electric machine. The system may include a plurality of hybrid switch power modules operable for converting a direct current (DC) input to an alternating current (AC) output suitable for powering the electric machine. The hybrid switch power modules may each include a first semiconductor switch connected in parallel with a second semiconductor switch, optionally with the first semiconductor switch having a first set of performance characteristics and the second semiconductor switch having a second set of performance characteristics differing at least partially from the first set of performance characteristics. The system may include a gate drive system operable for controlling each of the hybrid switch power modules between opened and closed states to facilitate converting the DC input to the AC output. The gate drive system may be configured for providing each power module with corresponding first and second control signals for respectively controlling the first and second semiconductor switches thereof between ON and OFF states, providing each power module with corresponding first and second slew rate signals for respectively controlling first and second slew rates of the first and second semiconductor switches thereof, and selecting the first and second control signals and the first and second slew rate signals independently for each of the power modules to optimize transitions between the opened and closed states as a function of operating conditions of the electric machine and the first and second sets of performance characteristics.

The gate drive system may include a controller configured for determining the first and second slew rates according to a plurality of slew rate regions defined relative to the operating conditions of the electric machine and the first and second sets of performance characteristics.

The slew rate regions may include at least a first region, a second region, and a third region, the first region defining slew rates slower than the second region and the second region defining slew rates slower than the third region.

Boundaries between the first, second, third regions may be defined relative to voltage, current, and/or temperature values selected for demarcating the operating conditions of the electric machine.

The controller may be configured for generating the first and second control signals according to a plurality of operating modes defined relative to the operating conditions of the electric machine and the first and second sets of performance characteristics.

The operating modes may include a dual mode for simultaneously controlling both of the first and second semiconductor switches to the ON state, a singular mode for controlling one of the first and second switches to the ON state and the other one of the first and second semiconductor switches to the OFF state, and an OFF mode for simultaneously controlling both of the first and second semiconductor switches to the OFF state.

The gate drive system may include first and second variable resistance circuits for each of the power modules, optionally with the first variable resistance circuits connecting to a first gate of the first semiconductor switch associated therewith and the second variable resistance circuits connecting to a second gate of the second semiconductor switch associated therewith.

The first and second variable resistance circuits may each include a plurality of buffer switches and a plurality of resistors, optionally with each of the buffer switches being operable between ON and OFF states to respectively connect and disconnect an associated one or more of the resistors to positive and/or negative power rails.

The first and second slew rate signals may be operable for selectively controlling the first and second slew rates by individually controlling the buffer switches between the ON and OFF states, and thereby the resisters connected to or disconnected from the positive and/or negative power rails.

The hybrid switch power modules include a first module, a second module, a third module, a fourth module, a fifth module, and a sixth module configured for connecting the electric machine to a rechargeable energy storage system (RESS) via a first phase leg, a second phase leg, and a third phase leg. The first and second modules may connect in series to form the first phase leg, the third and fourth modules may connect in series to form the second phase leg, and the fifth and sixth modules may connect in series to form the third phase leg.

The first semiconductor switches may be constructed as Metal-Oxide-Semiconductor Field-Effect Transistors (MOSFETs), and the second semiconductor switches may be constructed as Insulated Gate Bipolar Transistors (IGBTs).

The first semiconductor switches may be constructed as a silicon carbide (SiC) Metal-Oxide-Semiconductor Field-Effect Transistors (MOSFETs), and the second semiconductor switches may be constructed as Si Insulated Gate Bipolar Transistors (IGBTs).

The first semiconductor switches may be constructed as silicon type devices, and the second semiconductor switches may be constructed as wide bandgap (WBG) type devices.

One aspect of the present disclosure relates to a variable slew rate gate drive system for powering an electric machine. The system may include a first hybrid switch power module, a second hybrid switch power module, a third hybrid switch power module, a fourth hybrid switch power module, a fifth hybrid switch power module, and a sixth hybrid switch power module configured for connecting the electric machine to a rechargeable energy storage system (RESS) via a first phase leg, a second phase leg, and a third phase leg. The first and second hybrid switch power modules may connect in series to form the first phase leg, the third and fourth hybrid switch power modules may connect in series to form the second phase leg, and the fifth and sixth hybrid switch power modules may connect in series to form the third phase leg. Each of the first, second, third, fourth, fifth, and sixth hybrid switch power modules may each include a first semiconductor switch connected in parallel with a second semiconductor switch, optionally with the first semiconductor switches having a first set of performance characteristics and the second semiconductor switches having a second set of performance characteristics differing from the first set of performance characteristics. The system may include a gate drive system operable for controlling each of the first, second, third, fourth, fifth, and sixth hybrid switch power modules between opened and closed states to facilitate converting a direct current (DC) output of the RESS to an alternating current (AC) input suitable for powering the electric machine via the first, second and third phase legs. The gate drive system may be configured for providing each of the first, second, third, fourth, fifth, and sixth hybrid switch power modules with corresponding first and second control signals for respectively controlling the first and second semiconductor switches thereof between ON and OFF states, providing each of the first, second, third, fourth, fifth, and sixth hybrid switch power modules with corresponding first and second slew rate signals for respectively controlling first and second slew rates of the first and second semiconductor switches thereof, and selecting the first and second control signals and the first and second slew rate signals independently for each of the power modules to optimize converting the DC input to the AC output according to operating conditions of the electric machine and the first and second sets of performance characteristics.

The first set of performance characteristics may correspond with a first switching speed rating, a first voltage rating, a first current rating, and a first efficiency rating, and the second set of performance characteristics may correspond with a second switching speed rating, a second voltage rating, a second current rating, and a second efficiency rating. The first switching speed rating may be faster than the second switching speed rating, the first voltage rating may be less than the second voltage rating, the first current rating may be less than the second current rating, and the first efficiency rating may be greater than the second efficiency rating.

The first semiconductor switches may be constructed as a Silicon Carbide (SiC) Metal-Oxide-Semiconductor Field-Effect Transistors (MOSFETs), and the second semiconductor switches may be constructed as Si Insulated Gate Bipolar Transistors (IGBTs).

The gate drive system may include first and second variable resistance circuits for each of the first, second, third, fourth, fifth, and sixth hybrid switch power modules, optionally with the first variable resistance circuits connecting to a first gate of the first semiconductor switch associated therewith and the second variable resistance circuits connecting to a second gate of the second semiconductor switch associated therewith. The first and second variable resistance circuits may each include a plurality of buffer switches and a plurality of resistors, optionally with each of the buffer switches being operable between ON and OFF states to respectively connect and disconnect an associated one or more of the resistors to positive and/or negative power rails.

The gate drive system includes a controller configured for generating the first and second slew rate signals according to a plurality of slew rate regions defined relative to the operating conditions of the electric machine and the first and second sets of performance characteristics, and generating the first and second control signals according to a plurality of operating modes defined for switching the buffer switches between ON and OFF states relative to the operating conditions of the electric machine and the first and second sets of performance characteristics.

One aspect of the present disclosure relates to a vehicle. The vehicle may include an electric motor configured for converting an alternating current (AC) input to a mechanical output suitable for propelling the vehicle, a rechargeable energy storage system (RESS) connected to the electric motor via a first phase leg, a second phase leg, and a third phase leg, the RESS configured to provide a direct current (DC) output, and a first hybrid switch power module connected in series with a second hybrid switch power module to form the first phase leg, a third hybrid switch power module connected in series with a fourth hybrid switch power module to form the second phase leg, and a fifth hybrid switch power module connected in series with a sixth hybrid switch power module to form the third phase leg. Each of the first, second, third, fourth, fifth, and sixth hybrid switch power modules may each include a first semiconductor switch connected in parallel with a second semiconductor switch, optionally with the first semiconductor switches having a first set of performance characteristics and the second semiconductor switches having a second set of performance characteristics. The vehicle may include a gate drive system operable for controlling each of the first, second, third, fourth, fifth, and sixth hybrid switch power modules between opened and closed states to convert the DC output to the AC input. The gate drive system may be configured for providing each of the first, second, third, fourth, fifth, and sixth hybrid switch power modules with corresponding first and second control signals for respectively controlling the first and second semiconductor switches thereof between ON and OFF states, providing each of the first, second, third, fourth, fifth, and sixth hybrid switch power modules with corresponding first and second slew rate signals for respectively controlling first and second slew rates of the first and second semiconductor switches thereof, and selecting the first and second control signals and the first and second slew rate signals independently for each of the power modules to optimize powering of the electric motor based on the first and second sets of performance characteristics.

The first set of performance characteristics may correspond with a first switching speed rating, a first voltage rating, a first current rating, and a first efficiency rating, and the second set of performance characteristics may correspond with a second switching speed rating, a second voltage rating, a second current rating, and a second efficiency rating. The first switching speed rating may be faster than the second switching speed rating, the first voltage rating may be less than the second voltage rating, the first current rating may be less than the second current rating, and/or the first efficiency rating may be greater than the second efficiency rating.

These features and advantages, along with other features and advantages of the present teachings, may be readily apparent from the following detailed description of the modes for carrying out the present teachings when taken in connection with the accompanying drawings. It should be understood that even though the following figures and embodiments may be separately described, single features thereof may be combined to additional embodiments.

BRIEF DESCRIPTION OF THE DRAWINGS

The accompanying drawings, which may be incorporated into and constitute a part of this specification, illustrate implementations of the disclosure and together with the description, serve to explain the principles of the disclosure.

DETAILED DESCRIPTION

As required, detailed embodiments of the present disclosure may be disclosed herein; however, it may be understood that the disclosed embodiments may be merely exemplary of the disclosure that may be embodied in various and alternative forms. The figures may not be necessarily to scale; some features may be exaggerated or minimized to show details of particular components. Therefore, specific structural and functional details disclosed herein may need not to be interpreted as limiting, but merely as a representative basis for teaching one skilled in the art to variously employ the present disclosure.

Figure 1:
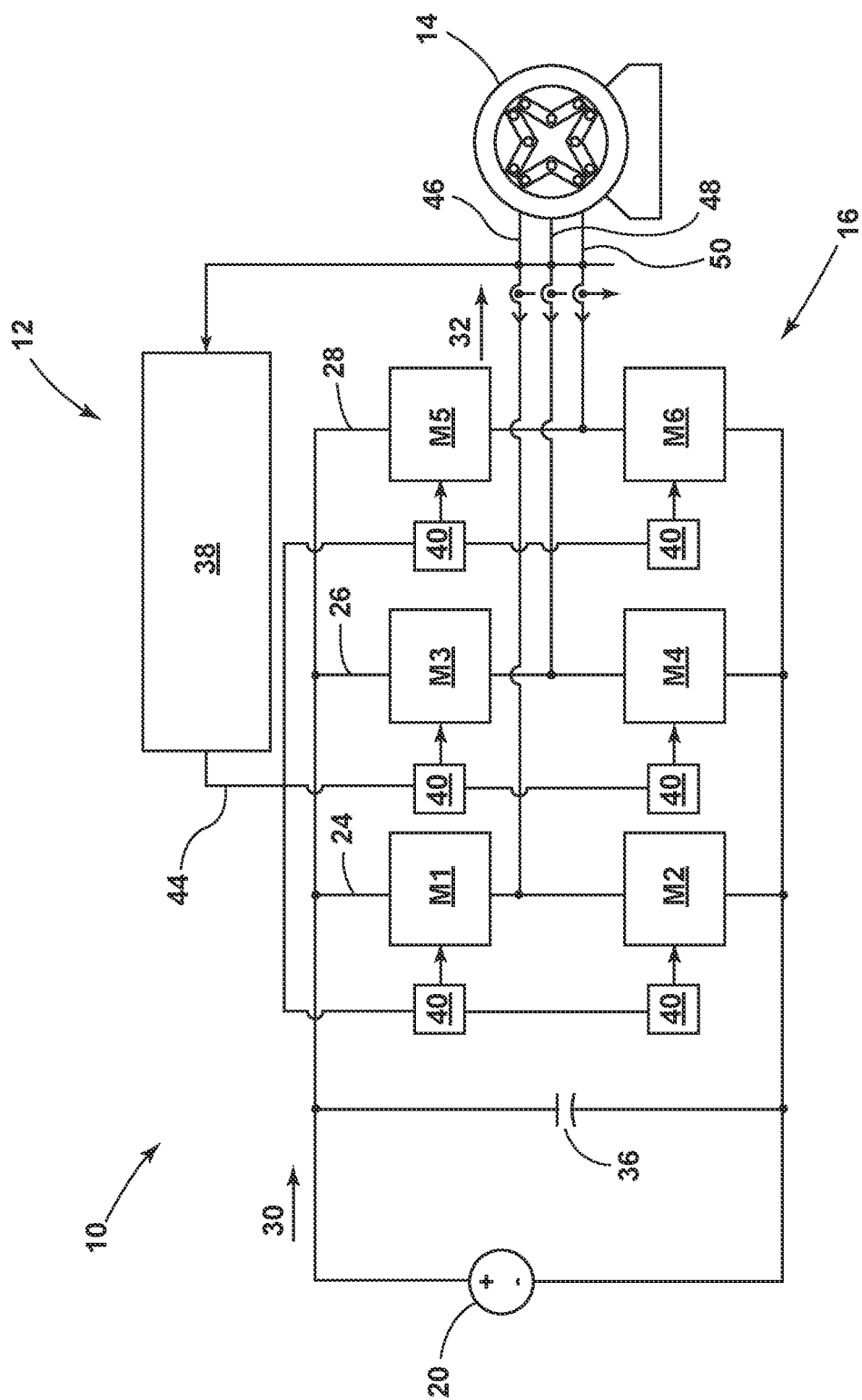
FIG. 1 illustrates a schematic view of a variable slew rate system in accordance with one aspect of the present disclosure.

FIG. 1 illustrates a schematic view of a variable slew rate system 10 in accordance with one aspect of the present disclosure. The system 10 may include a gate drive system 12 operable for powering an electric machine 14, which for exemplary purposes is predominantly described as an electric motor 14, generally referred to as a traction motor 14. The electric motor 14 may be of the type employed within a vehicle, such as an electric vehicle, to provide mechanical, tractive force operable for propelling the vehicle or otherwise performing work. As described in greater detail below, the gate drive system 12 may be operable for finely selecting and varying a slew rate for a plurality of hybrid switch power modules M1, M2, . . . M6 used as part of a power inverter module (PIM) 16 to facilitate powering the electric machine 14. The plurality of hybrid switch power modules M1, M2, . . . M6 may include a first module M1, a second module M2, a third module M3, a fourth module M4, a fifth module M5, and a sixth module M6 configured for connecting the electric machine 14 to a rechargeable energy storage system (RESS) 20 via a first phase leg 24, a second phase leg 26, and a third phase leg 28. The first and second modules M1, M2 may connect in series to form the first phase leg 24, the third and fourth modules M3, M4 may connect in series to form the second phase leg 26, and the fifth and sixth modules M5, M6 may connect in series to form the third phase leg 28. The gate drive system 12 may be operable for individually controlling the power modules M1, M2, . . . M6 between opened and closed states to facilitate converting a direct current (DC) output 30 of the RESS 20 to an alternating current (AC) input 32 to the electric machine 14.

The RESS 20 may be a battery or other energy storage device capable of selectively supplying electrical power to and receiving electrical power from the electric machine 14 via the PIM 16. A DC link capacitor 36 may be included to smooth, filter, and otherwise process the DC output 30 for use with the PIM 16. The gate drive system 12 may include a gate controller 38 operable for individually and specifically controlling a plurality of gate drive circuits 40 to control a rate, speed, timing, etc. of switching events for the power modules M1, M2, . . . M6, including those used to control transitioning of the power modules M1, M2, . . . M6 between ON and OFF or opened and closed states. The transitioning of the power modules M1, M2, . . . M6 between states may be performed according to corresponding control signals 44 provided from the gate controller 38. The controller 38 may be configured for individually providing the control signals 44 to each of the gate drive circuits 40. The controller 38 may include a non-transitory computer-readable storage medium having a plurality of non-transitory instructions stored thereon, which when executed with an associated one or more processors, may be operable in accordance with the present disclosure to facilitate generating the control signals 44 in a manner that provides a desirable slew rate while also managing the AC input 32 as needed for proper powering of the electric machine 14. The controller 38 may be used in this manner to facilitate switching events for the power modules M1, M2, . . . M6 whereby the DC output 30 may be converted to the AC input 32. The AC input 32 may be generated in the illustrated manner to provide a polyphase output having a plurality of AC signals 46, 48, 50 suitable for use in powering the electric machine 14, which are shown for non-limiting purposes to correspond with a three-phase implementation where a three-phase AC input 32 is provided to an AC bus or windings of the electric machine 14, such as via a corresponding input terminal for the associated AC input 32.

Figure 2:
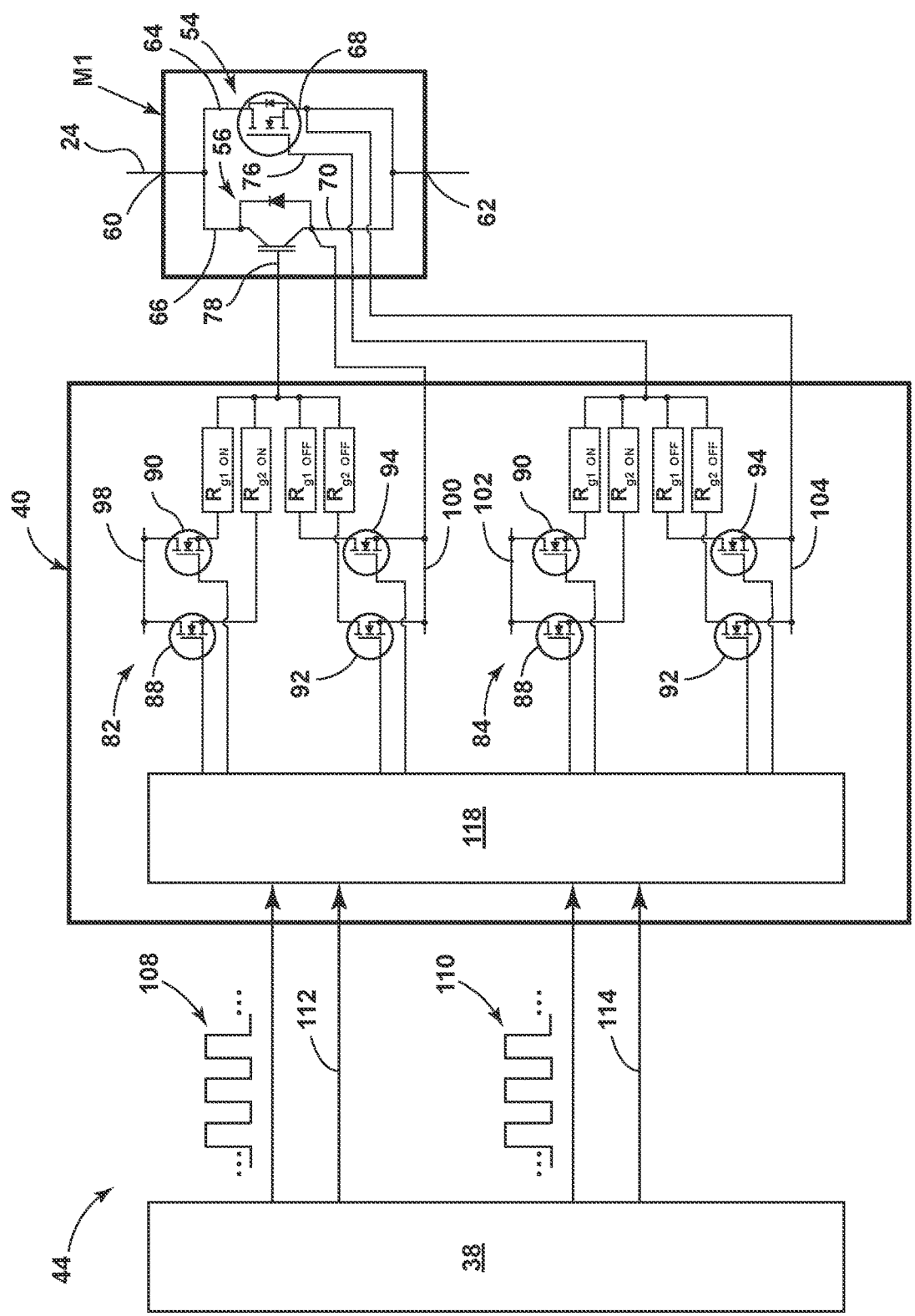
FIG. 2 illustrates a partial schematic view of the system in accordance with one aspect of the present disclosure.

FIG. 2 illustrates a partial schematic view of the system in accordance with one aspect of the present disclosure. The view illustrates one of the gate drive circuits 40 interacting with the first power modules M1, which is representative of how each gate drive circuit 40 would interact with the remaining power modules M2, . . . M6. The view additionally illustrates one aspect of the present disclosure whereby each of the power modules M1, M2, . . . M6 may include two or more semiconductor switches 54, 56, with two or more the switches 54, 56 having differing performance characteristics. The illustrated example includes the power module M1 having a first semiconductor switch 54 connected in parallel with a second semiconductor switch 56. The first and second semiconductor switches 54, 56 are shown to be connected in parallel for exemplary purposes as the present disclosure fully contemplates the switches 54, 56 being connected in series and/or additional switches 54, 56 being employed with the additional switches 54, 56 being connected in series and/or parallel with each other. The first and second semiconductor switches 54, 56 may be of a different technology such that the first semiconductor switches 54 may have a first set of performance characteristics and the second semiconductor switches 56 may have a second set of performance characteristics differing from the first set of performance characteristics. One aspect of the present disclosure contemplates varying slew rates of the semiconductor switches 54, 56 to optimize the DC-to-AC conversion, optionally by leveraging use of the differing performance characteristics of the semiconductor switches 54, 56 according to those most suitable for the present operating conditions of the electric machine.

The semiconductor switches 54, 56 may be comprised of a wide variety of semiconductors or other types of switches 54, 56 having differing technologies to facilitate the operations contemplated herein. Such switches 54, 56 may include, for example, the first semiconductor switches 54, 56 being constructed as Metal-Oxide-Semiconductor Field-Effect Transistors (MOSFETs) or Silicon Carbide (SiC) MOSFETs, the second semiconductor switches 54, 56 being constructed as Insulated Gate Bipolar Transistors (IGBTs) or Si IGBTs, and/or according to other differences, e.g., the first semiconductor switches 54 may be constructed as silicon type devices, and the second semiconductor switches 56 may be constructed as wide bandgap (WBG) type devices. In this variable technology configuration, the first set of performance characteristics may correspond with a first switching speed rating, a first voltage rating, a first current rating, and/or a first efficiency rating, and the second set of performance characteristics may correspond with a second switching speed rating, a second voltage rating, a second current rating, and/or a second efficiency rating. The first switching speed rating may be faster than the second switching speed rating, the first voltage rating may less than the second voltage rating, the first current rating may be less than the second current rating, and/or the first efficiency rating is greater than the second efficiency rating. The controller 38 may utilize these performance differences to control transitioning of the semiconductor switches 54, 56 between ON and OFF states according to variable slew rates.

The power modules M1, M2, . . . M6 may be constructed individually as discrete or separate integrated circuits (IC), which may be packaged in a corresponding housing. The power modules M1, M2, . . . M6 may each employee separate chips for the first and second semiconductor switches 54, 56 and/or additional switches included thereon. The power modules M1, M2, . . . M6 may include pins, traces, or other physical constructs to facilitate the electrical interconnections contemplated herein. While other arrangements are contemplated, the power modules M1, M2, . . . M6 are shown to include an input 60 and an output 62 to the associated phase leg 24, a drain 64 of the first semiconductor switch 54 connected to a collector 66 of the second semiconductor switch 56, a source 68 of the first semiconductor switch 54 connected to an emitter 70 of the second semiconductor switch 56, and a plurality of interfaces operable with the gate drive circuits 40 to facilitate biasing a gate 74 of the first semiconductor switch 54 and a gate 76 of the second semiconductor switch 56. The gate drive circuits 40 may include first and second variable resistance circuits 82, 84 for each of the power modules M1, M2, . . . M6. The variable resistance circuits 82, 84 may each include a plurality of buffer switches 88, 90, 92, 94 and a plurality of resistors. The buffer switches 88, 90, 92, 94 may be operable between ON and OFF states to respectively connect and disconnect an associated one or more of the resistors to positive and/or negative power rails 98, 100, 102, 104. The illustrated configuration includes each of the first and second variable resistance circuits 82, 84 including two ON buffer switches 88, 90, 92, 94 and two OFF buffer switches 88, 90, 92, 94 respectively for connecting and disconnecting two ON resistors Rg1_on, Rg2_on and two OFF resistors Rg1_off, Rg2_off to the positive and/or negative power rails 98, 100, 102, 104 and gates 76, 78 of the corresponding first and second semiconductor switches 54, 56.

The controller 38 may be configured to generate the control signals 44 to provide each gate drive circuit 40 with a corresponding first and second control signals 108, 110 for respectively controlling the first and second semiconductor switches 54, 56 between ON and OFF states and corresponding first and second slew rate signals 112, 114 for respectively controlling first and second slew rates of the first and second semiconductor switches 54, 56. The gate drive circuit 40 may include a gate driver 118 operable for processing the control and slew rate signals 108, 110, 112, 114 to implement the desired control via the variable resistance circuits 82, 84. The gate driver 118 may process the slew rate signals 112, 114 to determine the desired combinations of the ON and OFF resistors and process the control signals 108, 110 to determine desired timing of the buffer switches 88, 90, 92, 94 between ON and OFF states. While the present disclosure fully contemplates additional ON and OFF resistors and/or ON and OFF buffer switches 88, 90, 92, 94 being employed to facilitate additional resistor combinations, the illustrated configuration provides three different resistance combinations for each of the ON and OFF resistors, i.e. R1 ON/OFF, R2 ON/OFF, or R1 ON/OFF plus R2 ON/OFF. A duty cycle of the control signals 108, 110, which are shown to be pulse width modulate (PWM) signals, may be varied to finely adjust the gate voltage and/or current at precise levels depending ON the desired slew rate, e.g., to facilitate adjusting the slew rate in real-time according to desired operation of the electric machine 14. While not shown in individual detail, a plurality of sensors or other features may be employed to facilitate measuring or otherwise determining a DC voltage of the DC source 20, a temperature of the DC link capacitor 36, a current of one or more of the AC inputs 32, and a junction temperature, a maximum discharge time, a drain-source voltage (Vds), a voltage threshold (Vth) of the power modules M1, M2, . . . M6. The gate controller 38 may process the sensor measurements, metrics, etc. to determine a desirable slew rate for each of the power modules M1, M2, . . . M6, which may include selecting the control signals 44 to optimize transitions between the opened and closed states as a function of operating conditions of the electric machine and the first and second sets of performance characteristics.

One aspect of the present disclosure contemplates the controller 38 using temperature (simulated, calculated, or measured) per semiconductor switch technology, i.e., for each of the semiconductor switches 54, 56 having different performance characteristics, as inputs that allow for configurable over temperature warning, shutdown limits, or protection for slew rate usages. The controller 38 may include a slew rate selection process based on individual or combinations of the follow operating conditions: inverter terminal voltage, RESS open circuit voltage, RESS terminal, transistor temperature (measured or estimated), inverter output current, motor torque, motor speed, PWM frequency, PWM modulation type, dV/dt of dI/dt of the transistors, threshold voltage of the transistors, and/or voltage at the semiconductor switches 54, 56. Slew rate may be controlled by both the present/future operating conditions of the electric machine, and/or the present or future operating conditions of the electric propulsion system and/or other systems cooperating with the motor 14, e.g., the inverter may be controlled to set the torque and speed of the motor 14. The controller 38 may use one set of resistances for increasing efficiency in Enhanced Current Output Performance (ECOP) regions, use another set of resistances for peak current, and use the last set of resistance to increase losses in the inverter for use of the hybrid switches 54, 56 individually or in parallel. This can be used to optimize losses in different operation areas by using specific transistors and slew rates in specific regions also—optimization can be done based on using a combination specific transistor(s) and further specific slew rates. The controller 38 may use the variable slew rates to decrease losses, increase peak performance, and decrease chip/die temperatures during operation of the power electronic system for parallel or individual transistor operation and/or to protect the semiconductor switches 54, 56 from overvoltage.

Figure 3:
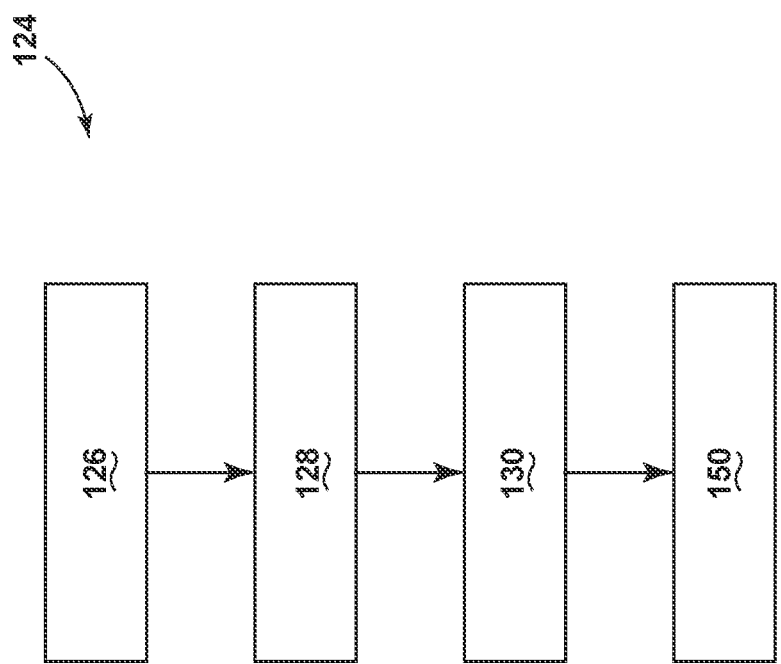
FIG. 3 illustrates a flowchart of a method for variable slew rate powering of an electric machine in accordance with one aspect of the present disclosure.

FIG. 3 illustrates a flowchart 124 of a method for variable slew rate powering of an electric machine in accordance with one aspect of the present disclosure. The method is predominantly described with respect to powering an electric motor configured for converting an AC input to a mechanical output suitable for propelling a vehicle for non-limiting purposes as the present disclosure fully contemplates the method being useful for powering other types of electric machines. Block 126 relates to a performance characteristics process whereby the controller 38 or other functioning element determines performance characteristics for a plurality of semiconductor switches 54, 56 included within each of a plurality of power modules M1, M2, . . . M6 configured for converting a DC output 30 to an AC input 32 suitable for powering the electric motor 14. The performance characteristics may relate to a wide variety of parameters, constraints, abilities, and other aspects of the semiconductor switches 54, 56, including those that may differentiate capabilities of the semiconductors switches 54, 56 relative to each other. Depending on the technology of the semiconductor switches 54, 56, one of the semiconductor switches 54, 56 included onboard one of the power modules M1, M2, . . . M6 may be more efficient, less expensive, more reliable, have higher operating boundaries than another one of the semiconductor switches 54, 56 included onboard the same power modules M1, M2, . . . M6. These performance characteristics may be analyzed to determine situations when one of semiconductor switches 54, 56 may be more favored than other semiconductor switches 54, 56 and/or when conditions may warrant use of both semiconductor switches 54, 56 simultaneously.

Block 128 relates to an operating conditions process whereby the controller 38 or other functioning element may determine operating conditions of the electric motor 14. The operating conditions may relate to a wide variety of parameters, constraints, abilities, values, and other aspects of the electric motor 14, including those associated with present or ongoing operating conditions and/or those expected to occur in the near future. The operating conditions, for example, may relate to bearing current, motor peak voltage, motor torque, motor speed, temperature, etc. Block 130 relates to a slew rate preference process whereby the controller 38 or other functioning element may determine preferences for varying the ON/OFF slew rate of the semiconductor switches 54, 56, and thereby transitioning of the power modules M1, M2, . . . M6 between opened and closed states. The slew rate preference process may include analysis of the performance characteristics associated with the semiconductor switches 54, 56 and the operating conditions of the electric motor 14 to determine whether it is desirable or optimal to prefer a faster slew rate, a slower slew rate, or a custom slew rate. A faster slew rate may result in less losses but at the consequence of less electromagnetic compatibility (EMC), i.e., more electromagnetic interference (EMI), while a slower slew rate may have the opposite result, i.e., more losses but at greater or improved EMC.

Figure 4:
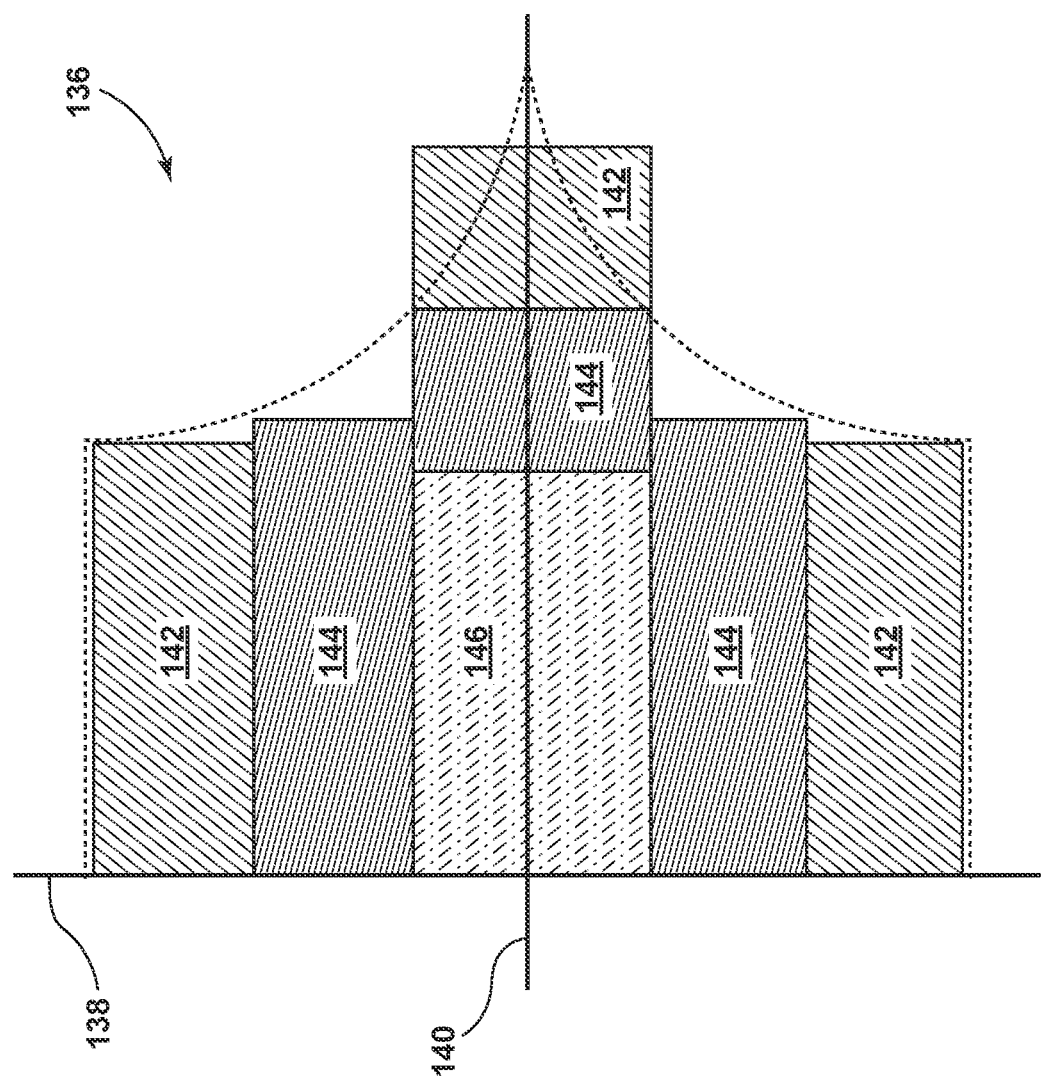
FIG. 4 illustrates a slew rate graph in accordance with one aspect of the present disclosure.

FIG. 4 illustrates a slew rate graph 136 in accordance with one aspect of the present disclosure. The graph includes a vertical axis 138 and a horizontal axis 140 to represent values useful in selecting or differentiating between slew rates preferred or desired at certain times. The values included in the axes 138, 140 may be delineated according to the various performance characteristics of the semiconductor switches 54, 56 and/or the operating conditions of the electric motor 14. For non-limiting purposes, the vertical axis 138 is described as corresponding with motor torque and the horizontal axis 140 is described as corresponding with motor speed. The graph 136 indicates a plurality of slew rate regions 142, 144, 146 defined relative to boundaries set according to motor torque and speed, however, similar demarcations may be defined and/or the motor torque and speed may be related or extrapolated, according to voltage, current, temperature, etc. The slew rate regions 142, 144, 146 may correspond with slew rates desired for differing combinations of motor torque and speed, which in the illustrated configuration includes a first region 142, a second region 144, and a third region 146. The first region 142 may be associated with a slew rate slower than the second region 144 and the second region 144 may associated with a slew rate slower than the third region 146. The use of three slew rates is presented for non-limiting purposes based on the above-described variable resistance circuits 82, 84 including three different combinations of resistors, i.e., each combination of resistors being associated with a difference in rate. As one skilled in the art may appreciate, additional granularity in the slew rates may be achieved by including additional resistor combinations in the variable resistance circuits 82, 84 or other capabilities for adjusting biasing of the semiconductor switches 54, 56.

Returning to FIG. 3, Block 150 relates to generating control and slew rate signals for respectively turning ON/OFF the semiconductor switches 54, 56 and the slew rate associated therewith. Depending on the slew rate region 142, 144, 146, the corresponding signals may result in one or both of the switches 54, 56 being controlled between ON and OFF states. Returning to FIG. 4, the first region 142 may include both switches 54, 56 being in the ON state, which may be referred to as a dual mode, with the resistors set to provide the first slew rate, the second region 144 may include both switches 54, 56 being in the ON state with the resistors set to provide the second slew rate, and the third region 146 may include the first switch being in the ON state while the second semiconductor switch 56 is in the OFF state with the resistors set to provide the third slew rate. The first, second, and third regions 142, 144, 146 are shown to repeat or be used at multiple locations as the use thereof may be desirable for more than one range of operating conditions. Additional slew rate graphs, charts, lookup tables, algorithms, formulas, and the like may be used to similarly define differing slew rate regions, particularly depending on desired preference. This, for example, may include defining differing slew rate regions as a function of efficiency, optimal loss, non-optimal loss, high loss, EMC, EMI, etc.

As supported above, the variable slew rate gate drive system may be beneficial in mitigating impacts of different turn-on/turn-off characteristics of two device types of semiconductor switches to ensure synchronized switching, controlling two or more different device types for use independently or in parallel, keeping those switches/transistors within rated operation while achieving higher efficiency by having discrete slew rates for corner case operation of each of the devices individually and/or optimized slew rates for operating regions important for minimal losses, providing gate driver flexibility and configurability that avoids limiting the semiconductors types that can be used in a hybrid switch power module, and/or decreased switching losses. The variable slew rates may be created by having at least two sets of gate resistors per transistor technology for both turn-on and turn-off (4 sets total per technology), such as four sets of Rg for SiC MOSFET and four sets for Si IGBT. The two sets of gate resistors, for turn-on and turn-off, can be used individually or in parallel, creating at least three sets of slew rates per transistor technology for turn-on and three sets for turn-off per transistor technology. The variable slew rates may be used to keep the transistors with the rated operational boundaries at maximum output current and maximum input voltage, while being able to decrease losses in the regions where the power electronic switch is used the most. In addition to ensuring the switches operate within rated voltage and can be as efficient as possible, the multiple slew rate design may be beneficial with current sharing and balancing between the transistor technologies through controlling turn-on and turn-off delays between the technologies independently to accommodate potential intrinsic or necessary delays for operation. Additionally, gate drive specifics may be used in selecting gate voltages needed for the switches, ensuring the switches may be held off, overcurrent protected, and overvoltage protected, optionally with simplification of PWM control.

While various embodiments have been described, the description is intended to be exemplary, rather than limiting and it will be apparent to those of ordinary skill in the art that many more embodiments and implementations are possible that are within the scope of the embodiments. Any feature of any embodiment may be used in combination with or substituted for any other feature or element in any other embodiment unless specifically restricted. Accordingly, the embodiments are not to be restricted except in light of the attached claims and their equivalents. Also, various modifications and changes may be made within the scope of the attached claims. Although several modes for carrying out the many aspects of the present teachings have been described in detail, those familiar with the art to which these teachings relate will recognize various alternative aspects for practicing the present teachings that are within the scope of the appended claims. It is intended that all matter contained in the above description or shown in the accompanying drawings shall be interpreted as illustrative and exemplary of the entire range of alternative embodiments that an ordinarily skilled artisan would recognize as implied by, structurally and/or functionally equivalent to, or otherwise rendered obvious based upon the included content, and not as limited solely to those explicitly depicted and/or described embodiments.

What is claimed is:

1. A variable slew rate gate drive system for powering an electric machine, comprising:
   a plurality of hybrid switch power modules operable for converting a direct current (DC) input to an alternating current (AC) output suitable for powering the electric machine, the hybrid switch power modules each including a first semiconductor switch connected in parallel with a second semiconductor switch, the first semiconductor switch having a first set of performance characteristics and the second semiconductor switch having a second set of performance characteristics differing at least partially from the first set of performance characteristics; and
   a gate drive system operable for controlling each of the hybrid switch power modules between opened and closed states to facilitate converting the DC input to the AC output, the gate drive system configured for:
      providing each hybrid switch power module with corresponding first and second control signals for respectively controlling the first and second semiconductor switches thereof between ON and OFF states;
      providing each hybrid switch power module with corresponding first and second slew rate signals for respectively controlling first and second slew rates of the first and second semiconductor switches thereof; and
      selecting the first and second control signals and the first and second slew rate signals independently for each of the hybrid switch power modules to optimize transitions between the opened and closed states as a function of operating conditions of the electric machine and the first and second sets of performance characteristics.

2. The system according to claim 1, wherein:
the gate drive system includes a controller configured for determining the first and second slew rates according to a plurality of slew rate regions defined relative to the operating conditions of the electric machine and the first and second sets of performance characteristics.

3. The system according to claim 2, wherein:
the slew rate regions include at least a first region, a second region, and a third region, the first region defining slew rates slower than the second region and the second region defining slew rates slower than the third region.

4. The system according to claim 3, wherein:
boundaries between the first, second, third regions are defined relative to voltage, current, and/or temperature values selected for demarcating the operating conditions of the electric machine.

5. The system according to claim 2, wherein:
the controller is configured for generating the first and second control signals according to a plurality of operating modes defined relative to the operating conditions of the electric machine and the first and second sets of performance characteristics.

6. The system according to claim 5, wherein:
the operating modes including a dual mode for simultaneously controlling both of the first and second semiconductor switches to the ON state, a singular mode for controlling one of the first and second switches to the ON state and the other one of the first and second semiconductor switches to the OFF state, and an OFF mode for simultaneously controlling both of the first and second semiconductor switches to the OFF state.

7. The system according to claim 6, wherein:
the gate drive system includes first and second variable resistance circuits for each of the hybrid switch power modules, wherein the first variable resistance circuits connect to a first gate of the first semiconductor switch associated therewith and the second variable resistance circuits connect to a second gate of the second semiconductor switch associated therewith.

8. The system according to claim 7, wherein:
the first and second variable resistance circuits each include a plurality of buffer switches and a plurality of resistors, wherein each of the buffer switches are operable between ON and OFF states to respectively connect and disconnect an associated one or more of the resistors to positive and/or negative power rails.

9. The system according to claim 8, wherein:
the first and second slew rate signals are operable for selectively controlling the first and second slew rates by individually controlling the buffer switches between the ON and OFF states, and thereby the resisters connected to or disconnected from the positive and/or negative power rails.

10. The system according to claim 9, wherein:
the hybrid switch power modules include a first module, a second module, a third module, a fourth module, a fifth module, and a sixth module configured for connecting the electric machine to a rechargeable energy storage system (RESS) via a first phase leg, a second phase leg, and a third phase leg, wherein the first and second modules connect in series to form the first phase leg, the third and fourth modules connect in series to form the second phase leg, and the fifth and sixth modules connect in series to form the third phase leg.

11. The system according to claim 10, wherein:
the first semiconductor switches are constructed as Metal-Oxide-Semiconductor Field-Effect Transistors (MOSFETs); and
the second semiconductor switches are constructed as Insulated Gate Bipolar Transistors (IGBTs).

12. The system according to claim 10, wherein:
the first semiconductor switches are constructed as a first type of wide bandgap (WBG) device; and
the second semiconductor switches are constructed as a second type of WBG device.

13. The system according to claim 10, wherein:
the first semiconductor switches are constructed as silicon type devices; and
the second semiconductor switches are constructed as wide bandgap (WBG) type devices.

14. A variable slew rate gate drive system for powering an electric machine, comprising:
a first hybrid switch power module, a second hybrid switch power module, a third hybrid switch power module, a fourth hybrid switch power module, a fifth hybrid switch power module, and a sixth hybrid switch power module configured for connecting the electric machine to a rechargeable energy storage system (RESS) via a first phase leg, a second phase leg, and a third phase leg, wherein the first and second hybrid switch power modules connect in series to form the first phase leg, the third and fourth hybrid switch power modules connect in series to form the second phase leg, and the fourth and fifth hybrid switch power modules connect in series to form the third phase leg, and wherein each of the first, second, third, fourth, fifth, and sixth hybrid switch power modules each include a first semiconductor switch connected in parallel with a second semiconductor switch, with the first semiconductor switches having a first set of performance characteristics and the second semiconductor switches having a second set of performance characteristics differing from the first set of performance characteristics; and
a gate drive system operable for controlling each of the first, second, third, fourth, fifth, and sixth hybrid switch power modules between opened and closed states to facilitate converting a direct current (DC) output of the RESS to an alternating current (AC) input suitable for powering the electric machine via the first, second and third phase legs, wherein the gate drive system is configured for:
providing each of the first, second, third, fourth, fifth, and sixth hybrid switch power modules with corresponding first and second control signals for respectively controlling the first and second semiconductor switches thereof between ON and OFF states;
providing each of the first, second, third, fourth, fifth, and sixth hybrid switch power modules with corresponding first and second slew rate signals for respectively controlling first and second slew rates of the first and second semiconductor switches thereof; and
selecting the first and second control signals and the first and second slew rate signals independently for each of the power modules to optimize converting the DC input to the AC output according to operating conditions of the electric machine and the first and second sets of performance characteristics.

15. The system according to claim 14, wherein:
the first set of performance characteristics correspond with a first switching speed rating, a first voltage rating, a first current rating, and a first efficiency rating;
the second set of performance characteristics correspond with a second switching speed rating, a second voltage rating, a second current rating, and a second efficiency rating; and
the first switching speed rating is faster than the second switching speed rating, the first voltage rating is less than the second voltage rating, the first current rating is less than the second current rating, and the first efficiency rating is greater than the second efficiency rating.

16. The system according to claim 15, wherein:
the first semiconductor switches are constructed as a Silicon Carbide (SiC) Metal-Oxide-Semiconductor Field-Effect Transistors (MOSFETs); and
the second semiconductor switches are constructed as Silicon (Si) Insulated Gate Bipolar Transistors (IGBTs).

17. The system according to claim 15, wherein:
the gate drive system includes first and second variable resistance circuits for each of the first, second, third, fourth, fifth, and sixth hybrid switch power modules, wherein the first variable resistance circuits connect to a first gate of the first semiconductor switch associated therewith and the second variable resistance circuits connect to a second gate of the second semiconductor switch associated therewith, wherein the first and second variable resistance circuits each include a plurality of buffer switches and a plurality of resistors, with each of the buffer switches being operable between ON and OFF states to respectively connect and disconnect an associated one or more of the resistors to positive and/or negative power rails.

18. The system according to claim 17, wherein:
the gate drive system includes a controller configured for:
generating the first and second slew rate signals according to a plurality of slew rate regions defined relative to the operating conditions of the electric machine and the first and second sets of performance characteristics; and
generating the first and second control signals according to a plurality of operating modes defined for switching the buffer switches between ON and OFF states relative to the operating conditions of the electric machine and the first and second sets of performance characteristics.

19. A vehicle, comprising:
an electric motor configured for converting an alternating current (AC) input to a mechanical output suitable for propelling the vehicle;
a rechargeable energy storage system (RESS) connected to the electric motor via a first phase leg, a second phase leg, and a third phase leg, the RESS configured to provide a direct current (DC) output;
a first hybrid switch power module connected in series with a second hybrid switch power module to form the first phase leg, a third hybrid switch power module connected in series with a fourth hybrid switch power module to form the second phase leg, and a fifth hybrid switch power module connected in series with a sixth hybrid switch power module to form the third phase leg;
wherein each of the first, second, third, fourth, fifth, and sixth hybrid switch power modules each include a first semiconductor switch connected in parallel with a second semiconductor switch, with the first semiconductor switches having a first set of performance characteristics and the second semiconductor switches having a second set of performance characteristics; and
a gate drive system operable for controlling each of the first, second, third, fourth, fifth, and sixth hybrid switch power modules between opened and closed states to convert the DC output to the AC input, wherein the gate drive system is configured for:
providing each of the first, second, third, fourth, fifth, and sixth hybrid switch power modules with corresponding first and second control signals for respectively controlling the first and second semiconductor switches thereof between ON and OFF states;
providing each of the first, second, third, fourth, fifth, and sixth hybrid switch power modules with corresponding first and second slew rate signals for respectively controlling first and second slew rates of the first and second semiconductor switches thereof; and
selecting the first and second control signals and the first and second slew rate signals independently for each of the power modules to optimize powering of the electric motor based on the first and second sets of performance characteristics.

20. The system according to claim 19, wherein:
the first set of performance characteristics correspond with a first switching speed rating, a first voltage rating, a first current rating, and a first efficiency rating;
the second set of performance characteristics correspond with a second switching speed rating, a second voltage rating, a second current rating, and a second efficiency rating; and
the first switching speed rating is faster than the second switching speed rating, the first voltage rating is less than the second voltage rating, the first current rating is less than the second current rating, and/or the first efficiency rating is greater than the second efficiency rating.

* * * * *